(12) United States Patent
Okuyama et al.

(10) Patent No.: US 6,867,541 B2
(45) Date of Patent: Mar. 15, 2005

(54) LINE STRUCTURE IN ELECTROLUMINESCENCE DISPLAY DEVICE

(75) Inventors: Masahiro Okuyama, Inazawa (JP); Naoaki Komiya, Ogaki (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 10/282,308

(22) Filed: Oct. 28, 2002

(65) Prior Publication Data

US 2003/0094895 A1 May 22, 2003

Related U.S. Application Data

(63) Continuation of application No. 09/672,856, filed on Sep. 28, 2000, now Pat. No. 6,531,815.

(30) Foreign Application Priority Data

Oct. 1, 1999 (JP) .............................................. 11-281792

(51) Int. Cl.[7] .................................................. H01J 1/62
(52) U.S. Cl. ........................ 313/506; 313/498; 257/347
(58) Field of Search ................................ 313/506, 498; 315/169.1–169.3; 257/347

(56) References Cited

U.S. PATENT DOCUMENTS

| | | | |
|---|---|---|---|
| 4,493,531 A | 1/1985 | Bohmer et al. ............. 350/336 |
| 4,954,746 A | 9/1990 | Taniguchi et al. .......... 313/506 |
| 5,378,519 A | 1/1995 | Kikuchi et al. ............. 428/690 |
| 5,510,918 A | 4/1996 | Matsunaga et al. ........... 359/88 |
| 5,684,365 A | 11/1997 | Tang et al. ............... 315/169.3 |
| 5,883,465 A | 3/1999 | Inoguchi et al. ............ 313/509 |
| 5,898,276 A | 4/1999 | Tsuruoka et al. ......... 315/169.3 |
| 5,936,344 A | 8/1999 | Nagayama ................... 313/506 |
| 5,962,970 A | 10/1999 | Yokoi et al. ................ 313/506 |
| 6,066,916 A | 5/2000 | Osada et al. ................ 313/505 |
| 6,091,382 A | 7/2000 | Shioya et al. ................. 345/76 |
| 6,111,357 A | 8/2000 | Fleming et al. ............. 313/509 |
| 6,140,765 A | 10/2000 | Kim et al. .................... 313/506 |
| 6,359,606 B1 | 3/2002 | Yudasaka ..................... 345/87 |
| 6,456,013 B1 * | 9/2002 | Komiya et al. ........... 315/619.1 |
| 6,462,722 B1 * | 10/2002 | Kimura et al. ................ 345/76 |
| 6,522,079 B1 * | 2/2003 | Yamada ................... 315/169.3 |
| 6,562,669 B2 * | 5/2003 | Suzawa et al. ............. 438/158 |

FOREIGN PATENT DOCUMENTS

| | | |
|---|---|---|
| GB | 2329280 | 3/1999 |
| JP | 6460993 | 3/1989 |
| JP | 3274694 | 12/1991 |
| JP | 6176868 | 6/1994 |
| JP | 7013183 | 1/1995 |
| JP | 7263140 | 10/1995 |
| JP | 7272849 | 10/1995 |
| JP | 8185978 | 7/1996 |
| JP | 9102393 | 4/1997 |
| JP | 10012386 | 1/1998 |
| JP | 10063198 | 3/1998 |
| JP | 10161149 | 6/1998 |
| KR | 1999-029645 | 4/1999 |

* cited by examiner

Primary Examiner—David V. Bruce
Assistant Examiner—Jurie Yun
(74) Attorney, Agent, or Firm—Cantor Colburn LLP

(57) ABSTRACT

A wide line portion is drawn from a cathode while another wide line portion is formed by gathered lines extending from cathode terminals. A contact of realtively large size is formed in a region where the two wide line portions overlap each other with an insulating film being interposed therebetween, so as to connect both wide line portions. Further, in this contact, the cathode terminals and the cathode are connected through an intermediate layer composed of a conductive oxide material. Thus, a reduction in the voltage to be applied to the cathode as a result of increased line resistance between the terminals and the cathode can be prevented, thereby preventing deterioration of display quality.

5 Claims, 7 Drawing Sheets

LINE STRUCTURE IN ELECTROLUMINESCENCE DISPLAY DEVICE

CROSS REFERENCE TO RELATED APPLICATIONS

This application is a continuation application of U.S. patent Ser. No. 09/672,856, filed on Sep. 28, 2000 now U.S. Pat. No. 6,531,815, which is herein incorporated by reference in its entirety.

BACKGROUND OF THE INVENTION

1. Field of the Invention

The present invention relates to an electroluminescence display device comprising electroluminescence elements and thin film transistors.

2. Description of Prior Art

In recent years, electroluminescence (referred to hereinafter as "EL") display devices comprising EL elements have gained attention as potential replacements for CRTs and LCDs. Research has been directed to the development of EL display devices using, for example, thin film transistors (referred to hereinafter as "TFT") as switching elements to drive the EL elements.

FIG. 1 is a plan view showing a display pixel of an organic EL display device. FIG. 2A shows a cross-sectional view taken along line A—A of FIG. 1 while FIG. 2B shows a cross-sectional view taken along line B—B of FIG. 1.

As shown in these drawings, a display pixel 20 is formed in a region surrounded by a gate line GL and a data line DL. A first TFT serving as a switching element is disposed near an intersection of those lines. The source of the TFT 1 simultaneously functions as a second capacitor electrode 3 such that, together with a first capacitor electrode 2, it forms a capacitor 8. The source is connected to a gate electrode 15 of a second TFT 4 that drives the organic EL element. The source of the second TFT 4 contacts with an anode 6 of the organic EL element, while the drain of the TFT 4 is connected to a power source line (drive line) VL.

The first capacitor electrode 2, which is made of a material such as chromium, overlaps, over a gate insulating film 7, the second capacitor electrode 3 integral with the source of the first TFT 1. The first capacitor electrode 2 and the second capacitor electrode 3 together store charges with the gate insulating film 7 being interposed therebetween as a dielectric layer. The storage capacitor 8 serves to retain voltage applied to the gate electrodes 15 of the second TFT 4.

The first TFT 1, the switching TFT, will now be described.

First gate electrodes 11 made of refractory metal such as chromium (Cr) or molybdenum (Mo) are formed on a transparent insulator substrate 10 made of quartz glass, non-alkali glass, or a similar material. As shown in FIG. 1, the first gate electrodes 11 are integrally formed with the gate line GL such that a plurality of these electrodes extend from the gate line GL in the vertical direction in parallel with each other. Referring to FIG. 2A, the first capacitor electrode 2 formed in the same process as that of the first gate electrodes 11 is provided to the right side of the first gate electrodes 11. This first capacitor electrode 2, which constitutes the storage capacitor 8, has an enlarged portion between the first TFT 1 and the second TFT 4 as shown in FIG. 1 and is integral with a storage capacitor line CL extending therefrom in the directions.

A first active layer 12 composed of poly-silicon (referred to hereinafer as "p-Si") film is formed on the gate insulating film 7. The first active layer 12 is of a so-called LDD (Lightly Doped Drain) structure. Specifically, low-concentration regions are formed on both sides of the gate. Source and drain regions, which are high-concentration regions, are further disposed on the outboard sides of the low-concentration regions. On the first active layer 12, a stopper insulating film 13 made of Si oxidation film is formed so as to prevent ions from entering the first active layer 12.

An interlayer insulating film 14 formed by sequential lamination of a $SiO_2$ film, a SiN film, and a $SiO_2$ film is provided on the entire surface over the gate insulating film 7, the active layer 12, and the stopper insulating film 13. The data line DL which functions as a drain electrode is electrically connected, through a contact hole C1 formed in the interlayer insulating film 14, to the drain in the active layer 12. A planarizing insulating film 18 made, for example, of an insulating organic resin is also formed over the entire surface for planarization.

In EL display devices which are driven by an electric current, the EL layers must have a uniform thickness. Otherwise, current concentration may occur in a portion of the layer having thinner thickness. Thus, a significantly high level of planarity is required at least in portions where the EL elements are to be formed, and therefore the above-described planarizing film 18 made of a material having fluidity prior to hardening is employed.

The second TFT 4 which drives the organic EL element will be described with reference to FIGS. 1 and 2B.

On the insulating substrate 10, second gate electrodes 15 made of the same material as the first gate electrodes 11 are provided, and a second active layer 16 is further formed on the gate insulating film 7. Then, a stopper insulating film 17 is formed on the second active layer 16 in a manner similar to the above-mentioned stopper insulating film 13.

Intrinsic or substantially intrinsic channels are formed in the second active layer 16 above the gate electrodes 15, and source and drain regions are formed on respective sides of these channels by doping p-type impurities, thereby constituting a p-type channel TFT.

The above-described interlayer insulating film 14 is provided on the entire surface over the gate insulating film 7 and the second active layer 16, and the power source line VL is electrically connected, through a contact hole C2 formed in the interlayer insulating film 14, to the drain in the active layer 16. Further, the planarizing film 18 is formed over the entire surface, such that the source is exposed through a contact hole C3 formed in the planarizing film 18 and the interlayer insulating film 14. A transparent electrode made of ITO (Indium Tin Oxide) that contacts the source through this contact hole C3, namely, the anode 6 of the organic EL element 20, is formed on the planarizing insulating film 18.

The organic EL element 20 is formed by laminating, in order, the anode 6, an emissive element layer EM comprising a first hole transport layer 21, a second hole transport layer 22, an emissive layer 23 and an electron transport layer 24, and a cathode 25 made of a magnesium-indium alloy. The cathode 25 is substantially disposed over the entire surface of the organic EL elements.

The principle and operation for light emission of the organic EL element is as follows. Holes injected from the anode 6 and electrons injected from the cathode 25 recombine in the emissive layer 23, to thereby excite organic molecules constituting the emissive layer 23, thereby generating excitons. Through the process in which these excitons undergo radiation until deactivation, light is emitted from the emissive layer. This light radiates outward through the transparent anode via the transparent insulator substrate and resultant light emission is observed.

As shown in FIG. 2B, the cathode 25 which drives the organic EL element is formed on the entire surface over the display pixel region as a common electrode, and is electrically connected to a terminal provided at one end of the transparent substrate 10.

The above-described structure, however, suffers from the following disadvantages. Namely, a DC or AC potential (most commonly a DC potential for an organic EL) is externally applied to the cathode 25, so that a current flows between the anode 6 and the cathode 25. Therefore, when the cathode 25 and the lines connected to the cathode 25 have high contact resistance or high line resistance, the bias to be applied to the cathode 25 is lowered, thereby degrading display quality.

SUMMARY OF THE INVENTION

The present invention was made in light of the above described disadvantages, and aims to prevent voltage drop caused by line resistance when an external power source is connected to a cathode.

To achieve the above object, according to one aspect of the present invention, there is provide an electroluminescence display device comprising, on an insulating substrate, a display region including a plurality of electroluminescence elements and a group of terminals disposed at an end portion of said substrate for connecting the device externally, wherein each of said plurality of electroluminescence elements comprises a first electrode and a second electrode, of which an upper layer electrode formed in the upper layer is electrically connected to a plurality of terminals of said group of terminals between the region in which said group of terminals are disposed and said display region.

According to another aspect of the present invention, there is provided an electroluminescence display device comprising, on an insulating substrate, a display region including a plurality of electroluminescence elements and a group of terminals disposed at an end portion of said substrate for connecting the device externally, wherein each of said plurality of electroluminescence elements comprises a first electrode and a second electrode, one of said first electrode and said second electrode is at least partially formed as a common electrode for a plurality of electroluminescence elements, and said common electrode is electrically connected to a plurality of terminals of said group of terminals between the region in which said group of terminals are disposed and said display region.

According to still another aspect of the present invention, in either of the above-described electroluminescence display devices, a wide line is extended from said upper layer electrode or the common electrode toward said group of terminals; lines are extended from corresponding plurality of terminals of said group of terminals toward the upper layer electrode, said lines being gathered to form a wide line; and said wide line at the terminal side and said wide line at the upper layer electrode side are connected in a wide contact portion.

By providing a plurality of terminals (cathode terminals, that is, common electrode terminals), a wide line space corresponding to the number of allotted terminals can be obtained between the plurality of terminals and the display region. Accordingly, a wide line can be formed in this space, which can then be used to reduce the line resistance. In addition, it is also possible to form a wide contact for connecting the cathode, which is an upper layer electrode, and the terminals, thereby further reducing the contact resistance.

Accordingly, when the plurality of electroluminescence elements emit light by applying a current to the emissive element layer by the first and second electrodes in the electroluminescence display device of the present invention, it is possible to prevent any drop in the current to be supplied due to line resistance. Therefore, it is possible to provide a display device capable of light emission with high luminance while simultaneously reducing power consumption.

According to another aspect of the present invention, there is provided an electroluminescence display device comprising, on an insulating substrate, a display region including a plurality of electroluminescence elements and a group of terminals disposed at an end portion of said substrate for externally connecting the device, wherein each of said plurality of electroluminescence elements comprises a first electrode and a second electrode, of which an upper layer electrode, a cathode, or a common electrode, formed in the upper layer is connected to lines extending from said group of terminals in a contact portion, and, in said contact portion, a contact intermediate layer composed of a conductive oxide is provided between said upper layer electrode and said lines.

According to still another aspect of the present invention, in the above-described electroluminescence display device, the contact intermediate layer is composed of the same material as the other electrode among said first and second electrodes, which is, for example, said anode.

According to further aspect of the present invention, said lines at the terminal side are composed of a metal material.

A metal material such as Al is often used for lines, including, for example, the lines drawn from the terminal side. However, oxide is likely to be generated on the surface of a metal material such as Al. According to the present invention, a contact intermediate layer composed of a conductive oxide is provided between the lines in the contact portion which connects the lines extending from the terminal side and the lines extending from the upper layer electrode, the cathode, or the common electrode. It is therefore possible to prevent the line material from being oxidized in the process of forming the contact. Further, because increase in the resistance can be prevented by oxidation of the contact intermediate layer itself, it is possible to ensure low contact resistance.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENT

To begin description of an EL display device of the present invention, a display pixel formed within a display region 300 enclosed by a dot line in FIG. 3A will be described. FIG. 4 is a plan view illustrating a display pixel of an EL display device. Referring to FIG. 4, regions shaded with dots and enclosed by dotted lines indicate regions formed by a gate material, regions enclosed by solid lines are p-Si layers, while hatched regions by dot lines and enclosed by solid lines indicate portions comprising a transparent electrode. Further, regions shaded with diagonal lines and enclosed by solid lines indicate portions formed by a metal material made principally of Al.

Figure 4:
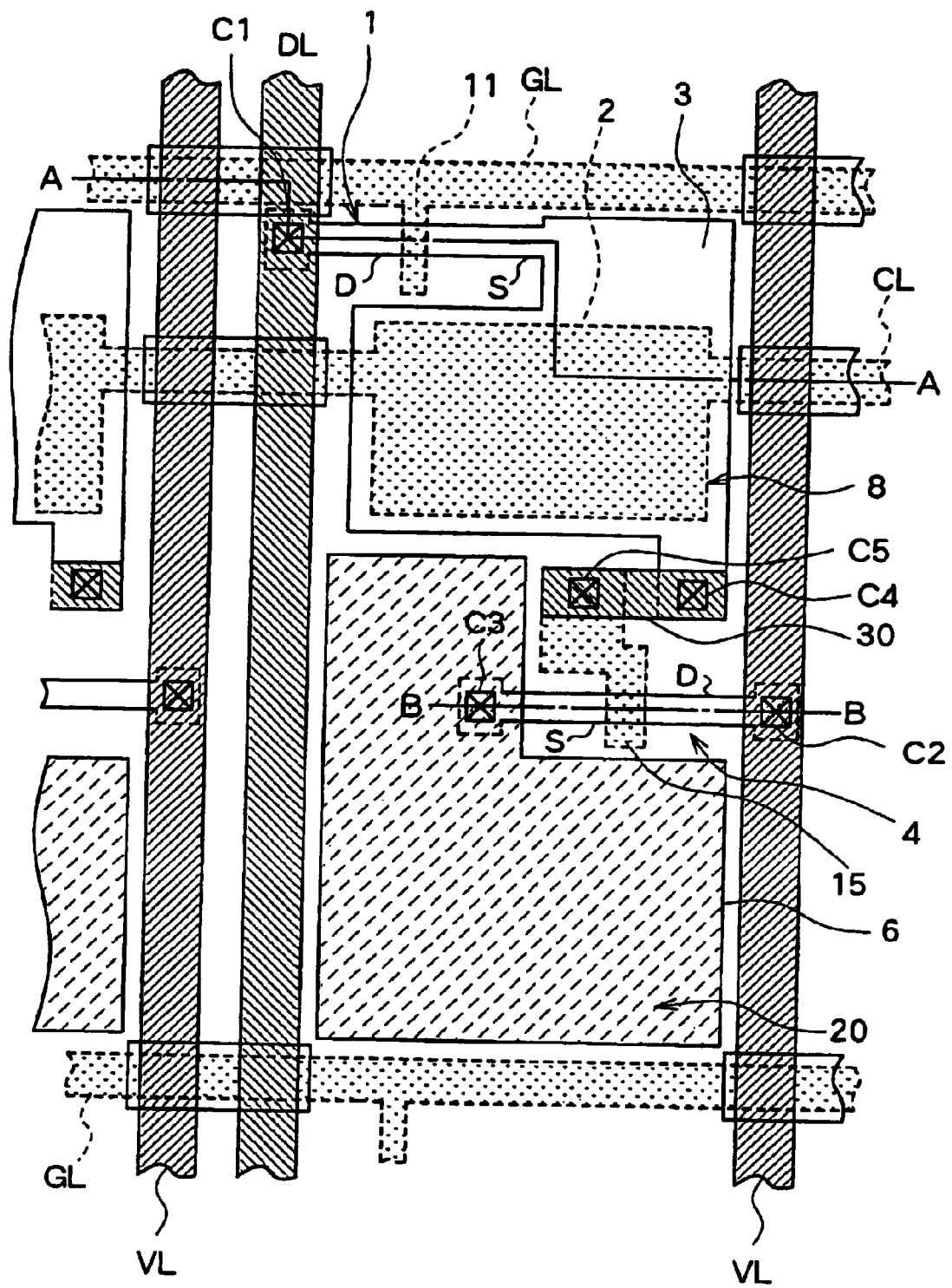
FIG. 4 is a plan view illustrating a display pixel of an EL display device of the present invention.
Figure 5A:
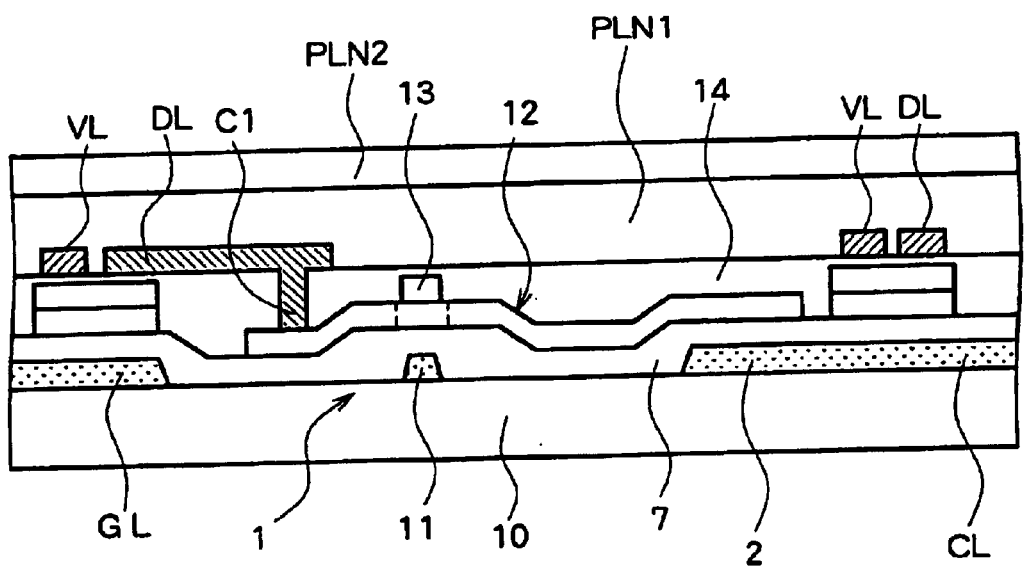
FIG. 5A is a cross-sectional view taken along line A—A of FIG. 4.
Figure 5B:
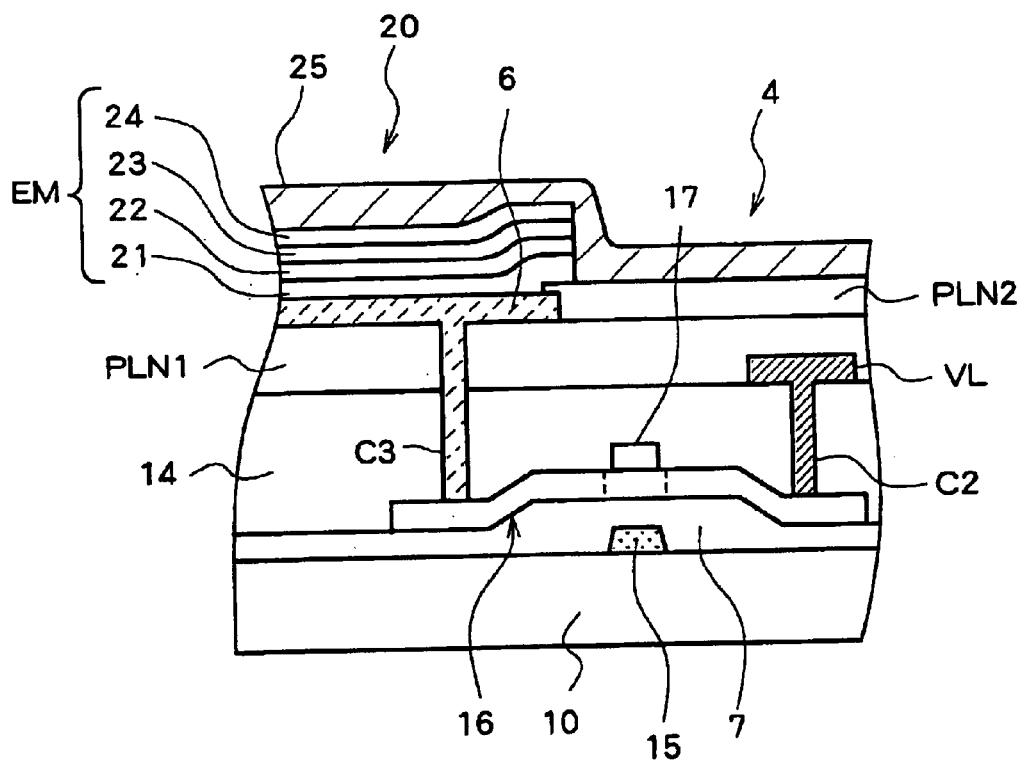
FIG. 5B is a cross-sectional view taken along line B—B of FIG. 4.

FIGS. 5A and 5B are cross sectional views taken along lines A—A and B—B, respectively, of FIG. 4. In the present example, both of the first and second TFTs 1 and 4 are of bottom-gate type, employ a Si film as the active layer, and include gate electrodes 11, 15 of the single-gate structure.

In FIG. 4, a display pixel is formed in a region surrounded by a gate line GL, a data line (drain line) DL and a power source line (drive line) VL.

A first preferred embodiment of the organic EL display device according to the present invention will be described in detail with reference to FIGS. 4, 5A and 5B.

First, a transparent substrate 10 which is insulating at least in the surface portion is provided. In the present embodiment, a metal cap (can) 200 which serves as a sealing substrate is disposed on the top surface of the substrate 10 so as to seal the EL material and protect the EL element against moisture. The metal cap 200 has a dent in the center portion. Because this metal cap 200 is opacity, light emission of the EL element must be transmitted from the substrate 10, which, for this reason, is transparent and is composed of a material such as glass or synthetic resin. However, when the cap 200 is transparent and the emitted light can be collected from the cap 200, the substrate 10 need not be transparent.

In the principle plane of the transparent substrate 10, gate lines GL extend in the row direction along the upper side of one pixel region shown in FIG. 4. A first capacitor electrode 2 which functions as a lower layer electrode of a storage capacitor 8 is further provided, with storage capacitor lines CL extending integrally therefrom substantially in parallel with the gate lines GL for connecting the first capacitor electrodes 2 of adjacent pixels. The lines GL, CL and the electrode 2 are both formed in the same layer and are indicated in the drawings as regions shaded with dots. These lines GL, CL and the electrode 2 are made of a refractory metal such as Cr or Ta because of a p-Si film formed by annealing in the upper layer. In this embodiment, the lines GL, CL and the electrode 2 are formed by spattering Cr of approximately 1000–2000 Å. In patterning, the sides are formed into a tapered shape considering step coverage.

Then, a gate insulating film 7 and an active layer are formed on the entire surface using plasma CVD. First, as the gate insulating film 7, an Si nitride film of approximately 500 Å and an Si oxide film of approximately 1300 Å are sequentially formed in this order from the bottom, and then an a-Si layer of approximately 500 Å is further laminated thereon. The semiconductor layer is first formed as above an a-Si film, which is then treated with annealing as will be described later to form a p-Si film. The p-Si film is then used for a first active layer 12, a second active layer 16 and a second capacitor electrode 3 which is an upper layer electrode of the storage capacitor 8.

The a-Si film is subjected to dehydrogenation annealing in a nitride atmosphere at approximately 400° C. and is subsequently poly-crystallized into the p-Si film using an excimer laser. Stopper insulating films 13 and 17 made of an Si oxide film provide a mask during doping process for the first and second active layers 12 and 16. The stopper insulating film may be replaced with a resist mask, which is removed after ion doping. Namely, P (phosphorus) ions are doped in the source and drain using the first stopper insulating film 13 as a mask to constitute an N-channel type TFT as the first TFT 1. On the other hand, B (boron) ions are doped in the source and drain using the second stopper insulating film 17 as a mask to constitute a P-channel type TFT as the second TFT 4.

The p-Si film is patterned in a desired shape using photolithography, as shown in FIG. 4. The p-Si layer serving as the active layer 12 of the first TFT 1 overlaps the data line DL near the intersection of the gate line GL and the data line DL and extends so as to traverse the gate electrode 11. Further provided is the second capacitor electrode 3 which is integral with this active layer 12 and is formed on the gate insulating film 7 as the upper electrode of the storage capacitor 8. The second capacitor electrode 3 constitutes a storage capacitor 8 together with a first capacitor electrode 2. This second capacitor electrode 3 composed of p-Si extends toward the vicinity of the second TFT 4 where it is electrically connected with the gate electrode 15 of the second TFT 4 via a connection line formed in the upper layer. The p-Si film serving as the active layer 16 of the second TFT 4, on the other hand, extends from under the power source line VL across the second gate electrode 15 toward under an anode 6 composed of a transparent electrode.

An interlayer insulating film 14 is formed over the p-Si film thus patterned in a desired form so as to cover the film. The interlayer insulating film 14 is of a three-layered structure in which, from the bottom, an Si oxide film of approximately 1000 Å, an Si nitride film of approximately 3000 Å, and an Si oxide film of approximately 1000 Å are sequentially laminated using continuous CVD. However, the interlayer insulating film 14 may comprise at least one layer and the film thickness is not limited to the above-described example.

On the interlayer insulating film 14, the data line DL, the power source line VL, and the connection line 30 are formed, as shown in FIGS. 5A and 5B. In the portions of the interlayer insulating film 14 corresponding to a contact hole C1 formed through the data line DL to the semiconductor layer 12 of the first TFT 1, a contact hole C2 formed through the power source line VL to the semiconductor layer 16 of the second TFT 4, and a contact hole C4 between the connection line 30 and the second capacitor electrode 3, through which the semiconductor layer formed in the lower layer is exposed. In a contact hole C5 formed between the connection line 30 and the second gate electrode 15, unlike other contact holes, the gate insulating film 7 as well as the insulating film 14 is formed between the layers and therefore the gate insulating film 7 is also etched to expose a Cr gate electrode 15. The line VL, DL and 30 have a laminated structure of the lower Mo layer of 1000 Å and the upper Al layer of 7000 Å and the upper Mo on the Al. The lower Mo layer is a barrier layer.

A planarizing film PLN1 of approximately 2–3 $\mu$m is further formed over the entire surface of the above-described lines and the interlayer insulating film 14. This planarizing film PLN1, together with a planarizing film PLN2 which will be described below, is employed for planarization in consideration of the emissive element film EM of the organic EL element to be formed above. Namely, the emissive element film EM containing organic EL material is an organic thin film having a laminated structure which comprises, in the present embodiment, a first hole transport layer 21, a second hole transport layer 22, an emissive layer 23, and an electron transport layer 24. Alternatively, the emissive element film may comprise one hole transport layer. The organic EL element thus configured employs thin films and is driven by an electrical current. Accordingly, unless the films have an extremely uniform thickness, a significant amount of current flows in thinner film portions, where luminance points with extremely strong light emission are generated. At these luminance points, the organic films are easily degraded, which, in the worst case, results in breakdown. To avoid such breakdown, the entire surface including the anode 6 must be as flat as possible. In this embodiment, acrylic liquid resin, for example, is applied as the planarizing films PLN1, PLN 2. Such liquid resin planarizes the top surface with fluidity before being hardened and preserves the planarized surface after hardening. However, the planarizing films PLN1 and PLN2 are not limited to an acrylic resin film.

In the present embodiment, it is necessary to connect the anode 6 with the source of the second TFT 4. Therefore, after forming the planarizing film PLN1, a contact hole C3 is first formed through the planarizing film PLN1 and the interlayer insulating film 14. Then, the anode 6 is formed on the planarizing film PNL1 so as to fill the contact hole 3, thereby connecting the anode 6 with the source region S of the second active layer 16 exposed at the bottom of the contact hole C3.

The anode 6 is formed by patterning ITO (Indium Tin Oxide) as shown in FIG. 4, and, over the entire surface over this anode 6, the planarizing film PLN2 is formed. The planarizing film PLN2 is then removed to expose the upper surface of the anode 6 except periphery edge of the anode 6. On the region of the anode 6 thus exposed by removal of the planarizing film PLN 2, the organic films which constitute the EL element are formed. Specifically, on the anode 6, an emissive element layer EM including the first hole transport layer 21 comprising MTDATA(4,4',4"-tris(3-methylphenylphenylamino)triphenylamine), a second hole transport layer 22 comprising TPD (N,N'-diphenyl-N,N'-di(3-methylphenyl)-1,1'-biphenyl-4,4'-diamine), an emissive layer 23 comprising quinacridon derivatives and Bebq$_2$(bis (10-hydroxybenzo[h]quinolinato)beryllium), and an electron transport layer 24 comprising Bebq$_2$, and a cathode 25 comprising magnesium-silver(Ag)-indium alloy, Al—Li alloy, or Al/LiF or the like are sequentially laminated. The thickness of the organic films is already described. The cathode 25 employs an Al/LiF alloy of 1000–2000 Å.

While the anode 6 must be patterned for each pixel, the films above the anode 6 may be formed with any one of the following structures: (1) a structure in which all the films from the anode 6 to the cathode 25 are patterned for each pixel; (2) a structure in which, in the above structure, the cathode 25 is formed on substantially all the surface over the display region unpatterned; or (3) a structure in which only the anode 6 is patterned for each pixel as in FIG. 4 and the remaining films above the anode 6 are formed unpatterned.

However, the cathode 25, which need not be patterned, is generally formed unpatterned over the entire surface.

Figure 1:
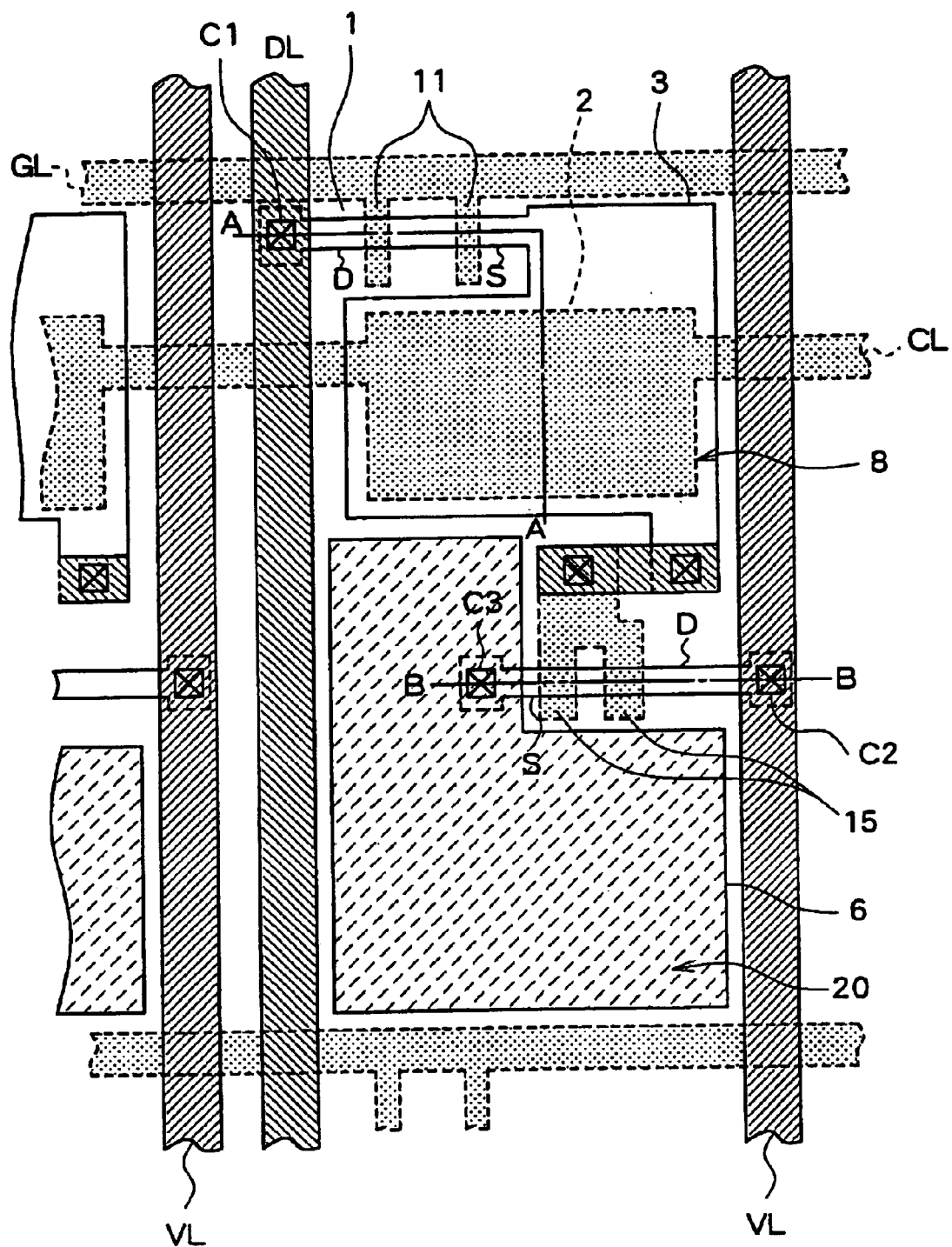
FIG. 1 is a plan view illustrating a prior art EL display device.
Figure 2A:
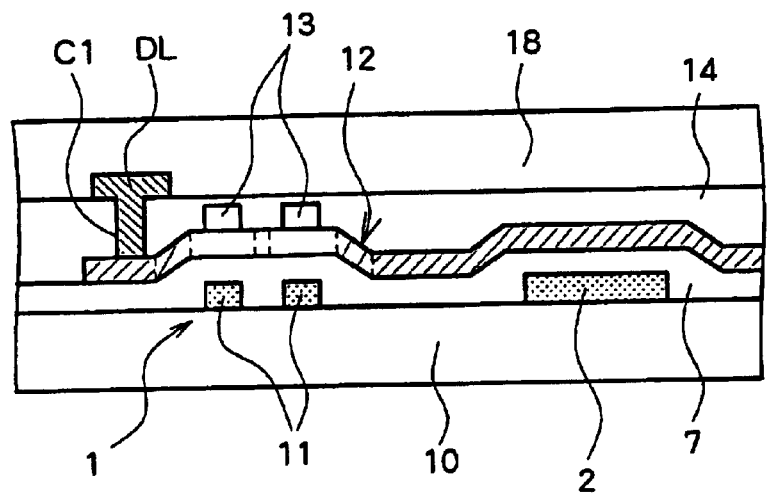
FIG. 2A is a cross-sectional view taken along line A—A of FIG. 1.
Figure 2B:
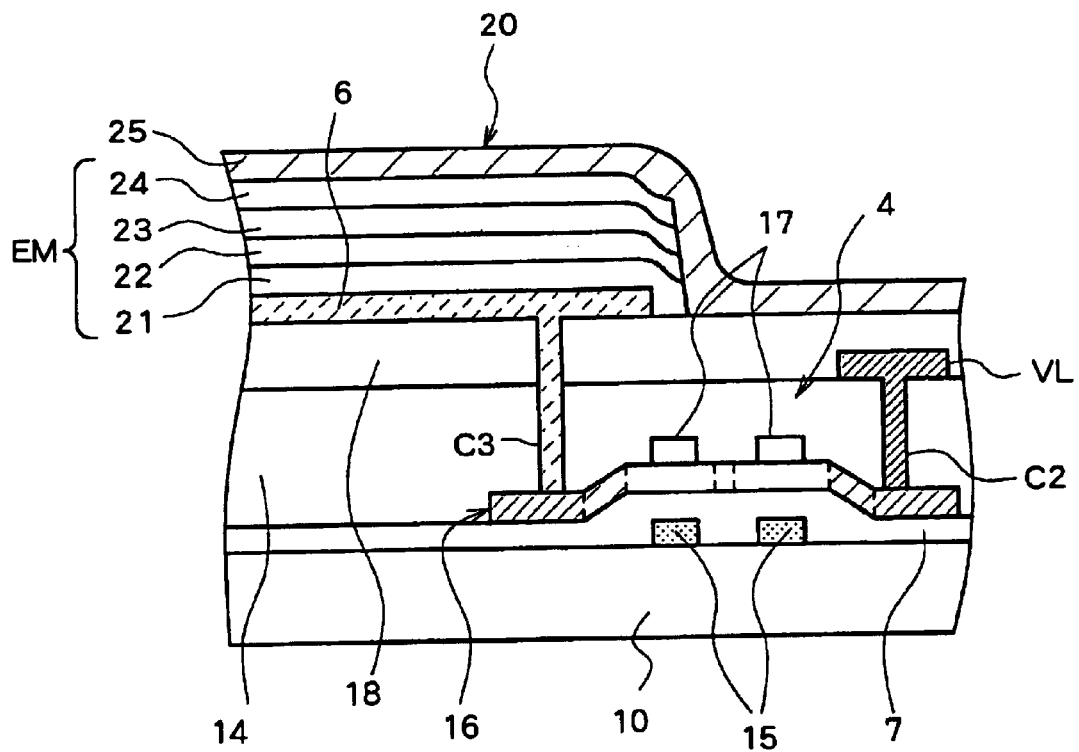
FIG. 2B is a cross-sectional view taken along line B—B of FIG. 1.
Figure 3A:
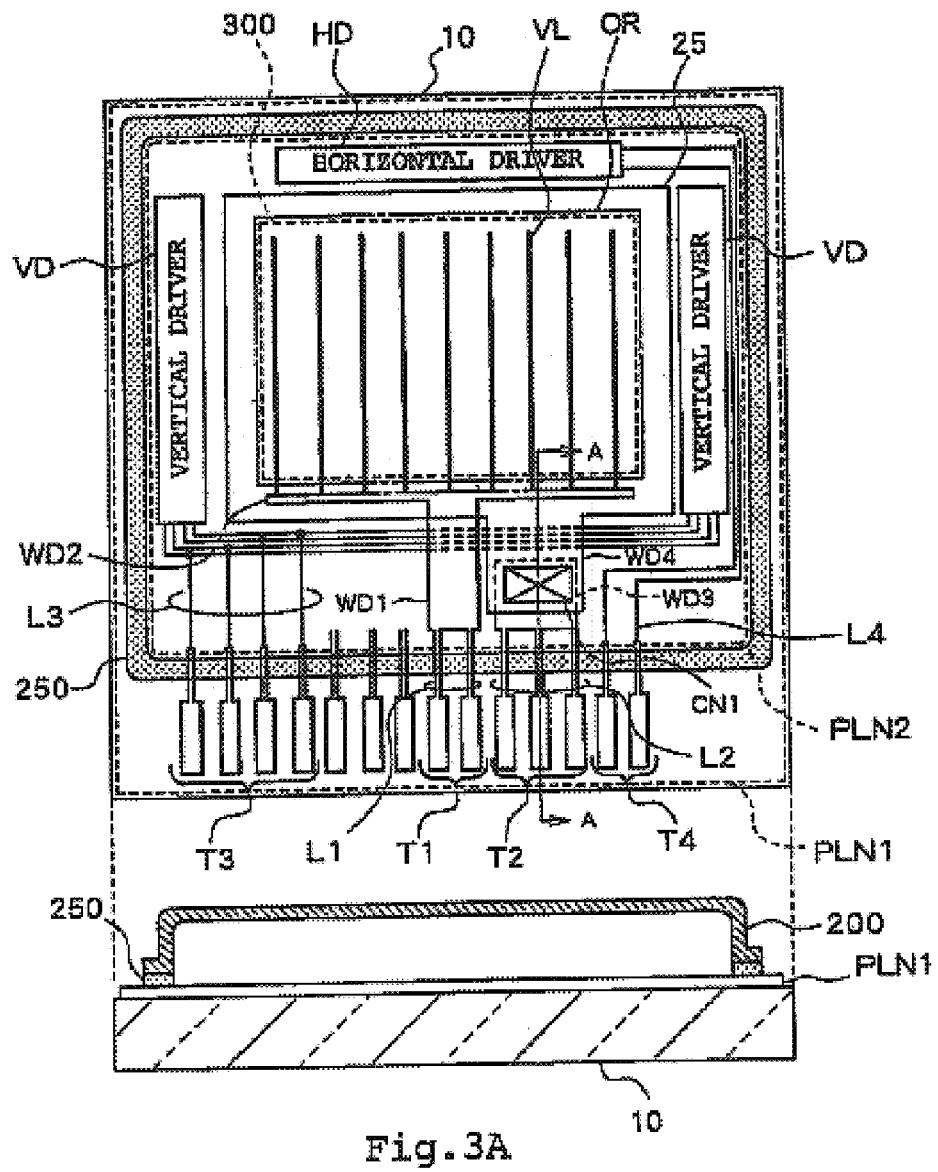
FIG. 3A is a conceptual view illustrating the overall structure of an EL display device according to a preferred embodiment of the present invention.

Further, because the EL layers deteriorate when exposed to water therefore should be protected against moisture, a metal cap (can) 200 is formed so as to seal the EL layers formed in the display region or to seal all the EL layers as in FIG. 3A. Accordingly, any film with strong moisture resistance characteristics which will not deteriorate the EL layers, such as a resin film, may be employed to cover the EL layers in place of a cap, or a metal cap 200 may be further provided over such a resin film.

The principle and operation for light emission of the organic EL element is as follows. Holes injected from the anode 6 and electrons injected from the cathode 25 recombine in the emissive element layer EM, to thereby excite organic molecules constituting the emissive element layer EM, thereby generating excitons. By the process in which these excitons undergo radiation until deactivation, light is emitted from the emissive layer. This light radiates outward through the transparent anode via the transparent insulator substrate, resulting in light emission.

Now, the structure including the peripheral portion of the display region 300 will be described with reference to FIGS. 3A and 3B. Referring to FIG. 3A, the outermost region surrounded by the solid line corresponds to the transparent substrate 10. The rectangular and innermost region surrounded by a dotted line indicates the display region 300. The rectangular region outside the display region 300 surrounded by one dot chain line corresponds to an organic film region OR where the emissive element layer EM is formed. The lines extending in the vertical direction within the display region 300 to form a combteeth shape, are the power source lines VL. The rectangular region surrounded by the bold solid line outside the organic film region OR indicates the cathode forming region 25. Further, the region surrounded by the outermost double bold solid lines and shaded with dots corresponds to a sealing region 250 of the metal cap 200 shown in the bottom figure, while the regions surrounded by dotted lines outside and inside of this sealing region 250 correspond respectively to regions covered with the first and second planarizing films PLN1, PLN2. Terminals T and lines L are exposed beyond the sealed area by the metal cap 200. In the region between the cathode forming region 25 and the sealing region 250, vertical drivers VD connected to the gate line GL are formed along the right and left sides of the display region 300 while a horizontal driver HD connected to the data line DL is formed along the upper side of the display region 300. These drivers VD, HD are composed of a thin film transistor which is formed simultaneously with formation of a thin film transistor formed in the display region 300. The right and left vertical drivers are connected with each other via, for example, four lines.

Terminals T1 are power source input terminals for applying a voltage to the power source lines VL, and first lines L1 extend from the two terminals T1, respectively, toward the sealed display region 300. The two first lines L1 are connected to a common first wide line portion WD1 in the sealed region. The first wide line portion WD1 is connected with a second wide line portion WD2 which extends in the horizontal direction in the lower region of the figure within the display region 300. The power source lines VL extend from the second wide line portion WD2 in the vertical (column) direction within the display region 300. The first lines L1, the first and second wide line portions WD1 and WD2, and the power source lines VL are integrally formed using the same material as the data lines DL.

Three cathode terminals T2 are each electrically connected with one of the corresponding second lines L2, which extend toward the display region 300 and are connected, through a third wide line portion WD3, to a fourth wide line portion WD4 which extends from the cathode 25 via a contact hole (CN1). The third wide line portion WD3 is integrally formed with the lines L2, which are combined in this wide line portion WD3.

Terminals T3 are each connected, via third lines L3, with a corresponding one among the four lines for connecting the vertical drivers VD formed along the right and left sides of the display region 300. In order to prevent these four lines from crossing the first wide line portion WD1, in the portion where these lines are indicated by dot lines, they are formed in the lower layer of the wide line portion WD1 where the layers same as the gates are formed, using the same material as the gates. Further, terminals T4 are connected via lines L4 with the horizontal driver HD.

As described above, the cathode 25 is connected to the cathode terminals T2 via the contact CN1 (the portion in FIG. 3A indicated with X) formed on the third wide line portion WD3 integrated with the second lines L2.

Because the space for one terminal and the line connected thereto is allotted according to the whole layout, the cathode contact CN1 can be of a large width corresponding to the number of cathode terminals T2. Further, the third wide line portion WD3 to which the second lines L2 are commonly connected and the fourth wide line portion WD4 extending from the cathode 25 to the contact CN1 can also have a width which substantially corresponds to the number of disposed cathode terminals T2.

By thus enabling the fourth wide line portion WD4 extending through the cathode contact CN1 to the cathode 25 and the third wide line portion WD3 extending through the cathode contact CN1 to the cathode terminal TN2 to both be wide, line resistance can be reduced. In addition, the cathode contact CN1 can also be formed so as to have substantially wide width, lowering contact resistance as well. Although three cathode terminals T2 are employed in this example, the width of the contact CN1 can be enlarged to thereby reduce contact resistance when at least two cathode terminals are used.

Figure 3B:
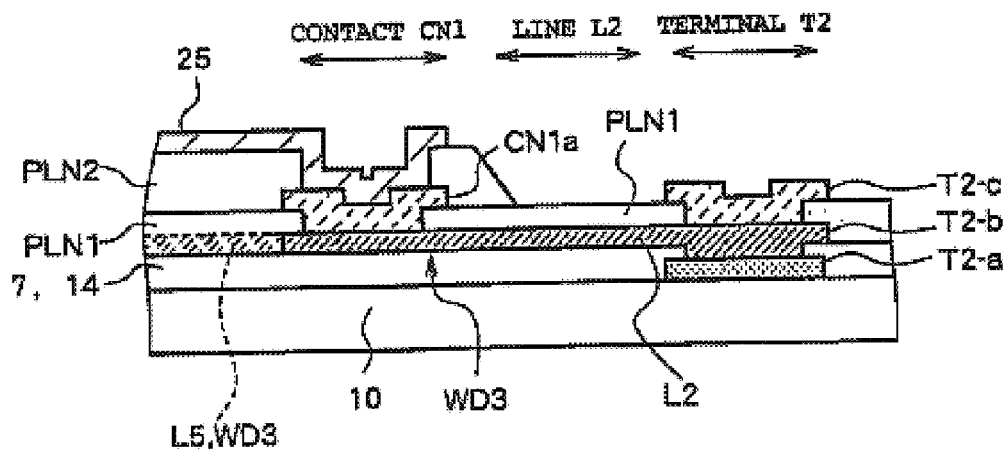
FIG. 3B is a cross-sectional view taken along line A—A of FIG. 3A.

FIG. 3B is a cross-sectional view taken along line A—A of FIG. 3A, which shows the vicinity of the cathode contact CN1. In FIG. 3B, from right of the figure, a terminal area corresponding to the region where the cathode terminals T2 are formed, a line area corresponding to the region where the second lines L2 are formed, and a contact area where a contact hole is formed, are depicted.

The terminal T2 has a three-layered structure in which the lowermost layer T2-$a$ is composed of the same material as the gate line, the middle layer T2-$b$ is composed of the same material as the data line DL and the power source line VL, and the uppermost layer T2-$c$ is composed of the same material as the anode 6, namely of ITO which constitutes a transparent electrode.

The contact hole CN1 is formed so as to penetrate the planarizing film PLN1. A contact intermediate layer CN1$a$ composed of oxide is then provided to fill this hole and thereby contact with the third wide line portion WD3 which is integral with the lines L2 exposed at the bottom of the hole. Then, the planarizing film PLN2 is formed on the entire surface, and a contact hole CN1 is formed in this planarizing film PLN2 so as to expose the intermediate layer CN1$a$. The cathode 25 is further formed thereabove. Thus, in the contact area, the line L2 and the cathode 25 are connected with each other via the intermediate layer CN1$a$. Because the intermediate layer CN1$a$ is composed of a conductive oxide, problems with remarkable loss of conductivity due to, for example, oxidation being advanced from the surface region under oxidation atmosphere, will not occur. For example, when heat treatment is performed for hardening the first and second planarizing films PLN1 and PLN2, and a treatment for opening the contact hole is also performed, material such as Al is easily oxidized. However, because the exposed portion in the contact hole formed in the first and second planarizing films PLN1 and PLN2 is composed of the conductive oxide film described above, rather than of Al which is easily oxidized, the film will not oxidize. Such conductive oxide materials include, for example, ITO.

An experiment was executed employing a conductive film of approximately 8000 Å composed of upper and lower layers of Mo and an intermediate layer of Al, which serves as a line, a cathode composed of Al/LiF alloy of approximately 2000 Å, and an ITO of 850 Å interposed therebetween, and the results showed that the contact resistance was reduced by approximately 10% compared to the case where no ITO was employed. This is because, by employing ITO in the intermediate layer of the contact CN1 as described above, the resistance of ITO is not changed and a preferable contact is therefore maintained even when the contact is exposed in the oxidization atmosphere.

Further, a pad area composed of a gate material similar to the lowermost layer T2-$a$ of the terminal T2 may be provided further below the third wide line portion WD3 in the contact area. Also, the lowermost layer T2-$a$ composed of a gate material in the terminal T2 may be eliminated.

Figure 6A:
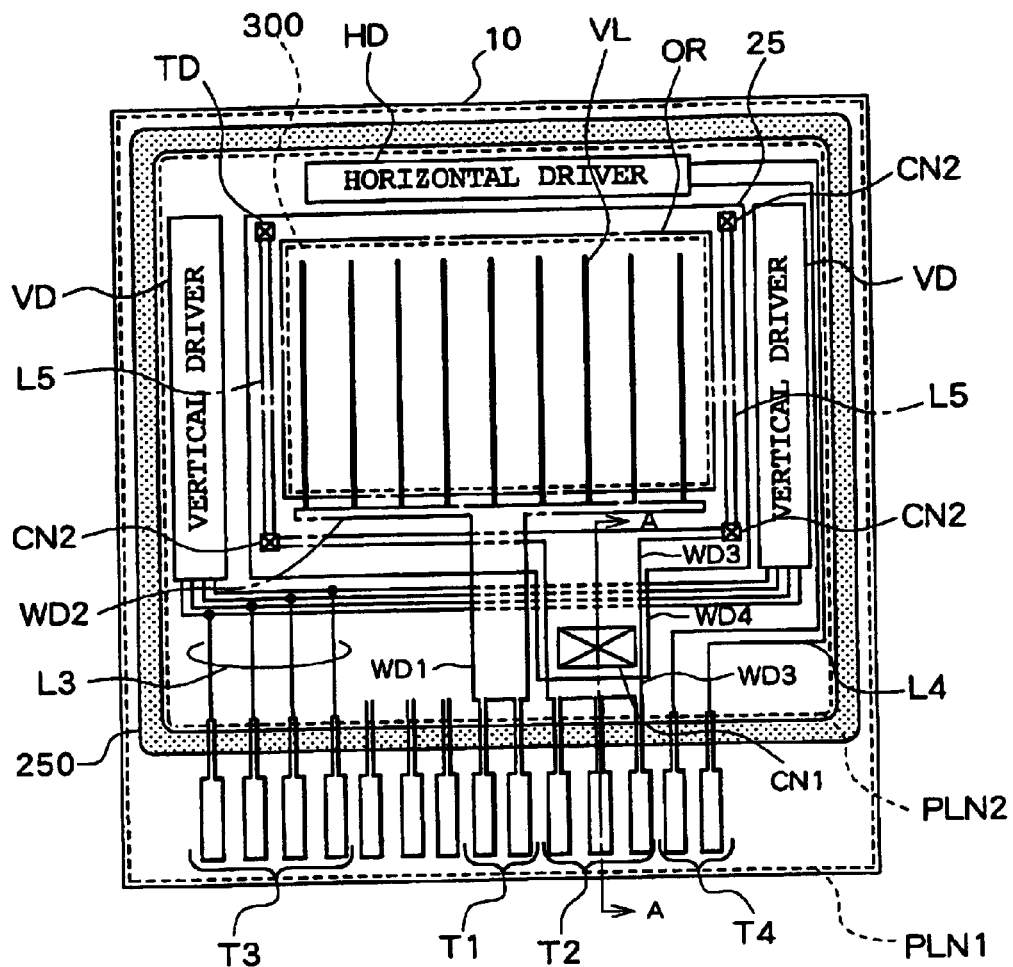
FIG. 6A is a conceptual view illustrating a whole structure of an EL display device according to another preferred embodiment of the present invention.

The structure in which contact resistance is further reduced will be described with reference to FIGS. 6A and 6B. In the following, description of components similar to those already described for FIGS. 3A and 3B will not be repeated.

This structure differs from that shown in FIGS. 3A and 3B, mainly the fifth line L5 formed along the outer periphery of the display region 300 or the organic film region OR surrounded by the chain line, and the second contact CN2. The fifth lines L5 are connected, in the second contact CN2, with the cathode 25 formed above, and are formed along the three sides of the display region 300 except for the side along which the horizontal driver HD is formed in the example of FIG. 6A. However, the fifth lines L5 may be formed so as to surround all sides of the display region 300. The fifth lines L5 are integrated with the third wide line portion WD3, contact with the cathode 25 at the contact CN1 as shown by a dot line in FIG. 3B, and extend as the second lines L2 toward the outside of the sealed region to further contact with the cathode terminals T2. The fifth line L5, similar to the four lines for connecting the vertical drivers VD, employs a crossover structure at the intersection with the first wide line portion WD1. Specifically, this structure is employed in the part of the line 5 indicated in FIG. 6A by a dotted line. This is because the fifth line L5, similar to the first wide line portion WD1, is made of the same material as the power source line VL simultaneously with the power source line V1 and therefore cannot cross the first wide line portion WD1. Accordingly, at the intersection, the line L5 composed of the same material with the power source line VL is connected with the layer formed simultaneously with the gate line using the same material as the gate. At the intersection, the fifth line L5 is thus disposed in the same layer as the gate, while the first wide line portion WD1 is disposed above, with the interlayer insulating film 7, 14 being formed therebetween, such that the line L5 and the wide line portion WD1 cross each other without short circuiting. The line L5 is once again formed of the same material as the power source line VL in a layer above the inter-line insulating film 7, 14 where the intersection region terminates.

The fifth line L5 and the cathode 25 which serves as the uppermost layer covering the surface beyond the display region 300 are connected with each other in the contact CN2. At least one contact CN2 is formed in the regions TD where the fifth line L5 and the cathode 25 overlap. In the present embodiment, the contact CN2 is formed at each of the four corners of the display region 300 as shown in FIG. 6A. Through these contacts CN2, the fifth line L5 and the cathode 25 are connected with each other. Because the fifth line L5 are integral with the second line L2, the cathode 25 and the cathode terminals T2 are electrically connected at contacts CN2.

Figure 6B:
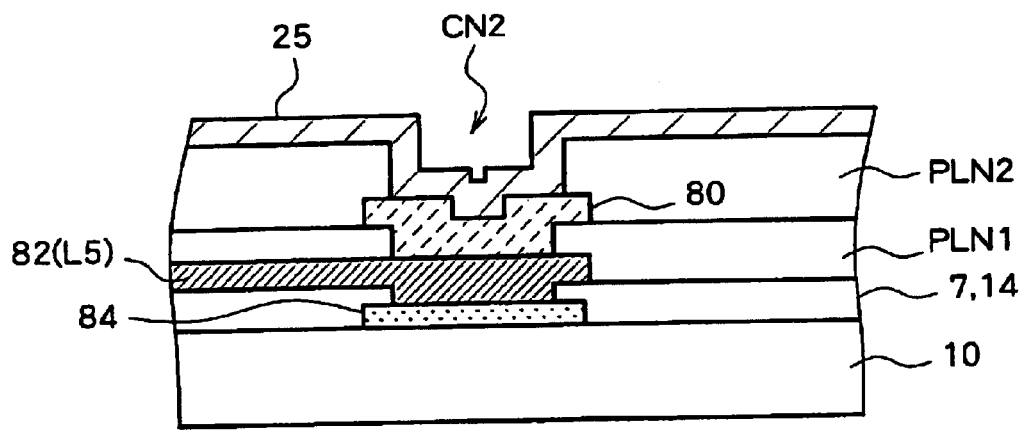
FIG. 6B is a view illustrating a contact CN2 of FIG. 6A.

The structure of the contact CN2 is shown in FIG. 6B in a cross section. The contact CN2 is of a three-layered structure (80,82,84) similar to the terminal area shown in FIG. 3B, and the cathode 25 is connected on the upper layer (a contact intermediate layer) 80. As shown in FIG. 6A, the fifth line L5 (82) extends along at least three sides of the overlap region TD around the display region 300, and is interposed between the lowermost layer 84 made of the same material as the gate line GL and the intermediate layer 80 composed of a conductive oxide while contacting with both layers in the contact portion CN2.

As in the contact CN1, the intermediate layer 80 composed of a conductive oxide material is formed between the cathode 25 and the fifth line L5 in the contact CN2. Therefore, it is possible to prevent the fifth line L5 (82) composed of the same material with the data line DL and the power source line VL formed below from being oxidized, while simultaneously preventing the contact intermediate layer 80 composed of a conductive oxide material from oxidized, thereby enabling the contact resistance to be reduced. Further, as shown in the multi-layer structure of FIG. 6B, the lower line layer 84 composed of a gate material may be provided under the fifth line L5 composed of Al which is the same material as the data line DL or the power source line VL. In this case, the whole fifth line L5 may be of a multi-layer structure together with the lower line layer 84, and the fifth line L5 and the line 84 made of the gate material are joined.

In FIG. 6B, the conductive material 80 composed of oxide is exposed from the second planarizing film PLN2 only in the portion of the contact CN2. Alternatively, the conductive material may be provided as the upper layer line 80 on the entire region where the fifth lines L5 are formed therebelow, and then the second planarizing film PLN2 may be removed to expose the conductive material 80 along the fifth line L5, thereby connecting the line L5 with the cathode via the removed portion. This structure can further reduce the contact resistance.

Although the line structure used in the bottom gate type TFT has been described, the present invention is also applicable to a top gate type TFT, as will be described as the second embodiment.

Figure 7A:
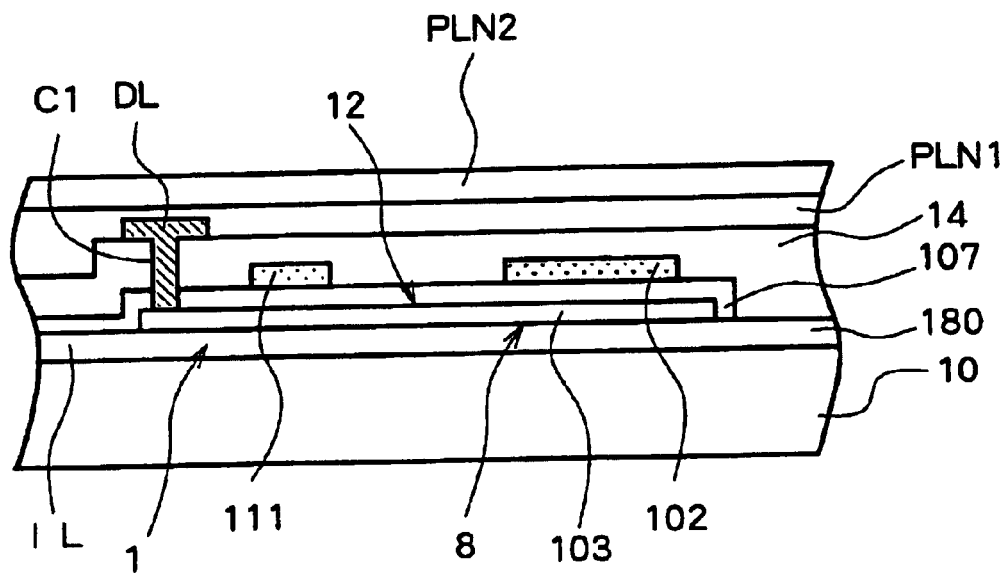
FIG. 7A is a cross-sectional view taken along line A—A of FIG. 4 when a top gate type TFT is employed.
Figure 7B:
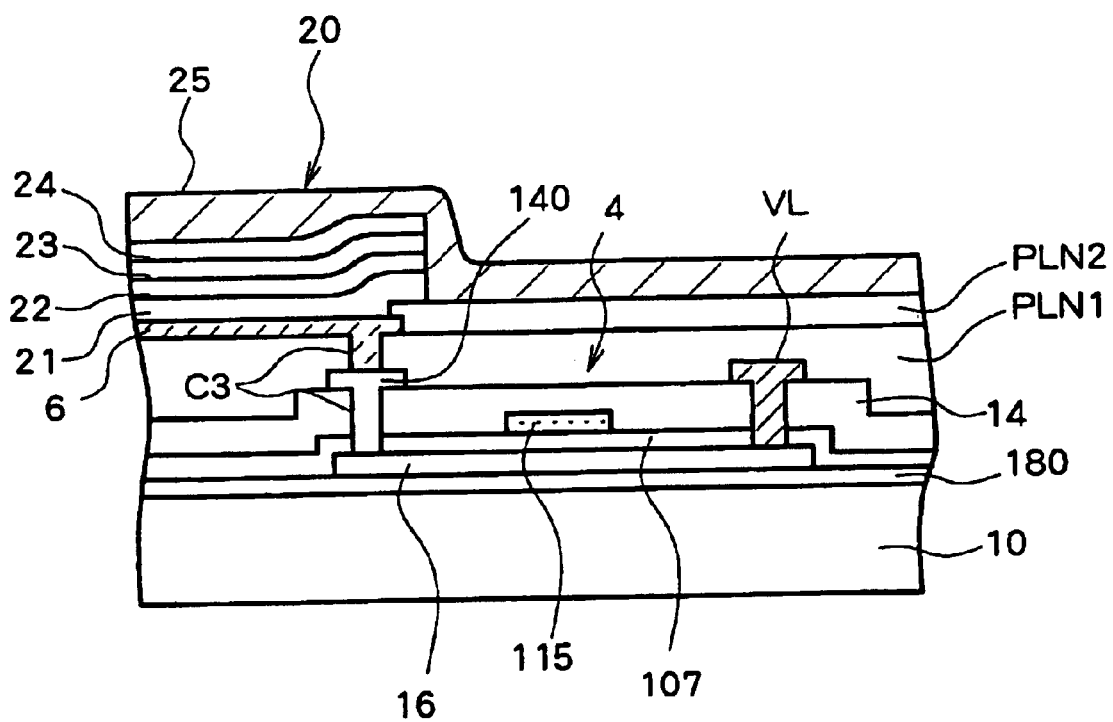
FIG. 7B is a cross-sectional view taken along line B—B of FIG. 4 when a top gate type TFT is employed.

A top gate type TFT has a plan view pattern which is substantially the same as that of a bottom gate type TFT shown in FIG. 4. FIGS. 7A and 7B are cross-sectional views taken along lines A—A and B—B of FIG. 4, respectively, depicting a display pixel when the TFT is of a top gate type structure. In FIGS. 7A and 7B, part corresponding to those in FIGS. 5A and 5B are designated by the same or similar numerals.

First, an insulating layer 180 formed by laminating a lower layer, which is an Si nitride film of 500 Å with an upper layer, which is an Si oxide film of 500 Å, is provided on the whole surface of a substrate 10. This Si nitride film serves as a stopper against impurities eluted from the glass.

Then, an active layer 12 of the first TFT 101; a lower electrode of a storage capacitor 8, which is integral with the active layer 12; and, at a portion where a second layer 16 of the second TFT 104 is formed; a semiconductor layer (p-Si or a-Si) are formed.

Over the entire surface over the semiconductor layer, a gate insulating film 107 is formed. A gate electrode 111 and a gate line GL integral with the gate electrode 111 are then formed on the gate insulating film 107, and simultaneously an upper layer electrode 102 of a storage capacitor 108 is composed of the same material and in the same layer as the gate electrode 111. The upper layer 102 of the storage capacitor 108 corresponds to the storage capacitor electrode 2 in FIG. 4 and is integrated with the storage capacitor line CL such that it extends in the row direction. The gate electrode may also be made of a material containing Al as a primary component. Al can be employed in this case because the inter-line insulating film 14 can be formed at a low temperature using plasma CVD or the like.

Impurities are doped in the semiconductor layer which functions as the active layer while the pattern of the gate electrode 111 is employed as a mask. Since P-channel and N-channel TFTs must be separately fabricated, while either one of P or N type impurities are doped in the active layer of one of the TFTs, the other TFT is masked with a resist. (This is similarly performed in the bottom gate type TFTs.) After impurities are doped, the semiconductor layer is patterned, and then the gate insulating film 107 described above is formed. Impurities are not doped in the semiconductor layer constituting a lower layer electrode 103 of the storage capacitor 8 due to the upper layer electrode 102 composed of the same material as the gate electrode. Rather, a voltage equals to or higher than that applied to the first gate electrode 111 is applied to the upper layer electrode 102 to cause a channel to be formed in the semiconductor layer, which then functions as a lower electrode 103.

After the doping process, the interlayer insulating film 14 is formed. Then, the data line DL and the power source line VL are formed, and the first planarizing film PLN1 is further formed thereon. On this film, a transparent electrode serving as an anode 6 is disposed. The anode 6 and the second TFT 4 may be connected via a source electrode 140 formed in the same layer as the power source line VL, or may be directly connected. Further, after the anode 6 is formed, the second planarizing film PLN2 is provided so as to planarize the first planarizing film PLN1 and the anode 6, with the portion of the second planarizing film PLN2 corresponding to the anode 6 being removed.

The EL element 20 which is similar to that in the foregoing embodiment will not be described again. In the present embodiment, the display device employs a three-layered structure composed of, from bottom, the gate electrodes 111, 115, a layer made of the same material as the data line, and a layer made of a transparent electrode material, such that the contacts CN1, CN2 can be of a layered structure identical to that shown in FIGS. 3B and 6B. The lines L1–L5 are also similar to those in the foregoing embodiment.

Although a p-Si film is used as a semiconductor film in the above-mentioned embodiments, a semiconductor film such as a microcrystal silicon film or an amorphous silicon film may be used. Also, although a single gate type TFT has been described, double gate type TFTs may be employed.

Further, although an organic EL display device was described in the foregoing embodiments, the present invention is not limited thereto and is also applicable to general light emission devices and to an inorganic EL display device comprising an emissive layer made of an inorganic material, achieving similar advantages.

While the preferred embodiment of the present invention has been described using specific terms, such description is for illustrative purposes only, and it is to be understood that changes and variations may be made without departing from the spirit or scope of the appended claims.

What is claimed is:

1. An electroluminescence display device comprising, on an insulating substrate, a display region including a plurality of pixels and a group of terminals disposed on an end portion of said substrate for externally connecting the device, wherein each of said plurality of pixels comprises an electroluminescence element, a storage capacitor, a thin film transistor for switching, and a thin film transistor for driving an element;

said thin film transistor for switching is connected to a gate line and to a data line;

said thin film transistor for switching is connected to a first electrode of said storage capacitor and to a gate of said thin film transistor for driving the element so that a signal corresponding to a data signal supplied from said data line is applied through said thin film transistor for switching to said first electrode of said storage capacitor and to said gate of said thin film transistor for driving the element;

said thin film transistor for switching and said thin film transistor for driving the element each has a single gate structure;

said electroluminescence element comprises a first electrode and a second electrode and is formed in an upper layer of said thin film transistor for switching and said thin film transistor for driving the element, one of said first electrode and said second electrode being selectively connected to a power source through an active layer of said thin film transistor for driving the element so as to receive an electric current from said power source, said electric current corresponding to a signal applied to a gate of said thin film transistor for driving the element;

said second electrode which is formed in an upper layer of said first electrode is connected to a line at a contact portion, said line extending from said group of terminals and composed of the same material as said data line which is connected to a source electrode or to a drain electrode of said thin film transistor for switching; and a contact intermediate layer is provided in said contact portion between said second electrode and of said line, said contact intermediate layer composed of a conductive oxide constituting said first electrode.

2. An electroluminescence display device according to claim 1, wherein said thin film transistor for driving the element is a P-channel type thin film transistor.

3. An electroluminescence display device according to claim 1, wherein said thin film transistor for switching and said thin film transistor for driving the element each is a bottom gate type thin film transistor wherein an active layer composed of poly-silicon is formed above a gate electrode with a gate insulating layer interposed therebetween.

4. An electroluminescence display device comprising, on an insulating substrate, a display region including a plurality of pixels and a group of terminals disposed on an end portion of said substrate for externally connecting the device, wherein each of said plurality of pixels comprises an electroluminescence element, a storage capacitor, a thin film transistor for switching, and a thin film transistor for driving an element;

said thin film transistor for switching is connected to a gate line and to a data line;

said thin film transistor for switching is connected to a first electrode of said storage capacitor and to a gate of said thin film transistor for driving the element so that a signal corresponding to a data signal supplied from said data line is applied through said thin film transistor for switching to said first electrode of said storage capacitor and to said gate of said thin film transistor for driving the element;

said thin film transistor for driving the element is a p-channel type thin film transistor having a single gate structure;

said electroluminescence element comprises a first electrode and a second electrode and is formed above said thin film transistor for switching and said thin film transistor for driving the element, one of said first electrode and said second electrode being selectively connected to a power source through an active layer of said thin film transistor for driving the element so as to receive an electric current from said power source, said electric current corresponding to a signal applied to a gate of said thin film transistor for driving the element; and said second electrode which is formed above said first electrode is electrically connected to a line layer extending from said group of terminals, and comprises a contact portion in which at least said second electrode and a layer composed of a conductive metal oxide identical to that of said first electrode are connected, on a connection path between said second electrode and said line layer.

5. An electroluminescence display device according to claim 4, wherein said thin film transistor for switching has a single gate structure.

* * * * *